United States Patent
Vollrath (12)

(10) Patent No.: US 6,207,513 B1
(45) Date of Patent: Mar. 27, 2001

(54) SPACER PROCESS TO ELIMINATE CORNER TRANSISTOR DEVICE

(75) Inventor: Joerg Vollrath, Richmond, VA (US)

(73) Assignee: Infineon Technologies North America Corp., Cupertino, CA (US)

( * ) Notice: Subject to any disclaimer, the term of this patent is extended or adjusted under 35 U.S.C. 154(b) by 0 days.

(21) Appl. No.: 09/432,063

(22) Filed: Nov. 2, 1999

(51) Int. Cl.[7] ................................................. H01L 21/336
(52) U.S. Cl. .................... 438/296; 438/297; 438/424; 438/437
(58) Field of Search .................... 438/197, 294, 438/296, 297, 424, 437

(56) References Cited

U.S. PATENT DOCUMENTS

| | | | |
|---|---|---|---|
| 5,436,190 | 7/1995 | Yang et al. | 437/67 |
| 5,741,738 | 4/1998 | Mandelman et al. | 438/296 |
| 5,741,740 | 4/1998 | Jang et al. | 438/435 |
| 5,763,315 | 6/1998 | Benedict et al. | 438/424 |
| 5,899,727 | 5/1999 | Hause et al. | 438/444 |
| 5,923,991 | 7/1999 | Bronner et al. | 438/424 |

*Primary Examiner*—Long Pham (57) ABSTRACT

A method for forming spacers for preventing formation of parasitic corner devices in transistors includes etching trenches into a semiconductor substrate to form an active area region, lining the trenches and the active area region with a first dielectric material and forming shallow trench isolation regions adjacent to the active area region by filling the trenches with a second dielectric material. The first dielectric material is removed from the active area region, and a gate oxide is formed over the active area region wherein divots form between the active area region and the shallow trench isolation regions. Dopants are implanted into the active area region to form a source and drain of the transistor. After the step of implanting, a spacer layer formed from a third dielectric material is deposited over the gate oxide layer to fill the divots. Anisotropically etching of the spacer layer forms spacers in the divots such that gate conductor material is prevented from entering the divots and the gate conductor material is spaced apart from corners of the active area region by the spacers to prevent the formation of the parasitic corner devices.

16 Claims, 6 Drawing Sheets

SPACER PROCESS TO ELIMINATE CORNER TRANSISTOR DEVICE

BACKGROUND

1. Technical Field

This disclosure relates to a method for eliminating parasitic corner devices which form at corners of active areas in semiconductor devices and more particularly, to a method for forming an isolation spacer for increasing a threshold voltage for the parasitic corner devices.

2. Description of the Related Art

Figure 1A:
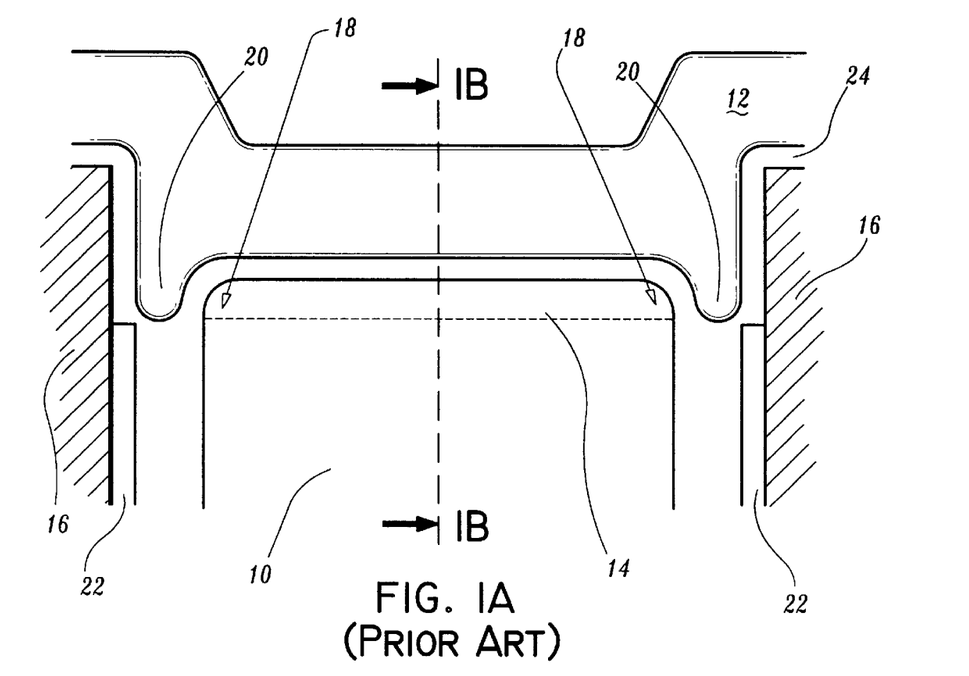
FIG. 1A is a cross-sectional view of a conventional transistor having parasitic corner transistors formed therein in accordance with the prior art.
Figure 1B:
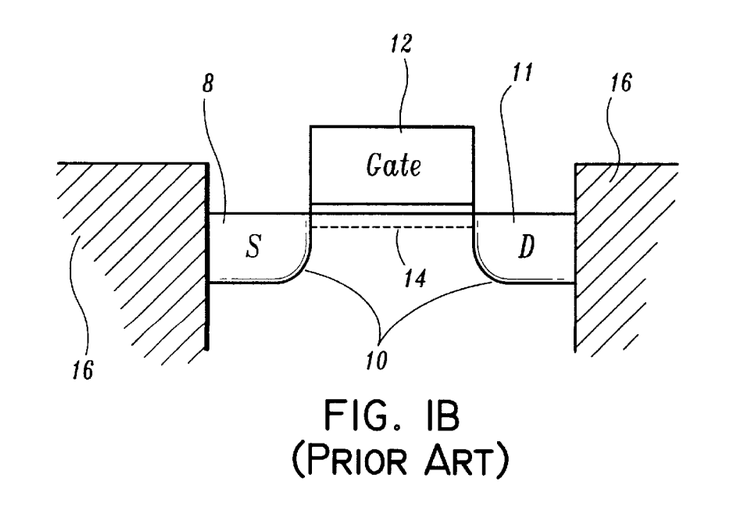
FIG. 1B is a cross-sectional view taken at section line 1B—1B of the conventional transistor of FIG. 1A.

Field effect transistors (FET) for semiconductor devices typically include a doped active area 10 where a channel 14 forms between a source 8 and a drain 12 of the FET as shown in FIGS. 1A and 1B. When a gate electrode 12 is activated under proper conditions, conduction of current between source and drain occurs through a channel 14 (shown in phantom lines) below the gate electrode 12. Many transistor designs include an active area which is at a different height relative to isolation regions 16 adjacent to the active area 10. Due to process control, these isolation regions 16 may be lower or higher than active area 10.

Due to the height difference between the active areas 10 and the adjacent isolation regions 12, parasitic corner devices 18 are formed between the corners of the active areas and a portion of the gate conductor formed in a divot 20 adjacent to the corners. The divot 20 is created during the formation removal of a silicon nitride liner 22 formed in shallow trenches adjacent to the active areas 10. When a gate oxide 24 is formed the divot 20 remains and fills with polysilicon of the gate electrode 12. This parasitic leakage due to the corner device reduces FET performance and leads to errors in data or malfunctions in the FET.

Therefore, a need exists for a spacer which fills the divot to prevent the gate conductor from entering the divot. A further need exists for such a spacer to be formed after implantation of active areas to further reduce a threshold voltage of parasitic corner devices.

SUMMARY OF THE INVENTION

A method for forming spacers for preventing formation of parasitic corner devices in transistors, in accordance with the present invention, includes etching trenches into a semiconductor substrate to form an active area region, lining the trenches and the active area region with a first dielectric material and forming shallow trench isolation regions adjacent to the active area region by filling the trenches with a second dielectric material. The first dielectric material is removed from the active area region, and a gate oxide is formed over the active area region wherein divots form between the active area region and the shallow trench isolation regions. Dopants are implanted into the active area region to form a source and drain of the transistor. After the step of implanting, a spacer layer is formed from a third dielectric material over the gate oxide layer to fill the divots followed by anisotropically etching the spacer layer to form spacers in the divots such that gate conductor material is prevented from entering the divots, and the gate conductor material is spaced apart from corners of the active area region by the spacers to prevent the formation of the parasitic corner devices.

A method for forming a dielectric spacers for preventing formation of parasitic corner devices in field effect transistors includes the steps of etching trenches into a silicon substrate to form an active area region, lining the trenches and the active area region with silicon nitride, forming shallow trench isolation regions adjacent to the active area region by filling the trenches with a silicon dioxide, and removing the silicon nitride from the active area region. A gate oxide is formed over the active area region wherein divots form between the active area region and the shallow trench isolation regions. Dopants are implanted into the active area region to form a source and drain of the field effect transistor. After the step of implanting, a spacer layer is formed from a third dielectric material over the gate oxide layer to fill the divots followed by anisotropically etching the spacer layer to form spacers in the divots such that gate conductor material is prevented from entering the divots, and the gate conductor material is spaced apart from corners of the active area region by the spacers to prevent the formation of the parasitic corner devices.

In alternate methods, the third dielectric material may be selectively etched relative to the gate oxide. The third dielectric material may include a nitride or an oxide. The third dielectric material may be deposited by a chemical vapor deposition process. The first dielectric material may include silicon nitride. The second dielectric material may include silicon oxide. The step of forming shallow trench isolation regions adjacent to the active area region by filling the trenches with a second dielectric material may include the step of forming shallow trench isolation regions adjacent to the active area region such that the active area region is disposed above a top surface of the second dielectric material. The step of forming shallow trench isolation regions adjacent to the active area region by filling the trenches with a second dielectric material may include the step of forming shallow trench isolation regions adjacent to the active area region such that the active area region is disposed below a top surface of the second dielectric material. The trenches may be filled with silicon dioxide. The spacer layer may include a thickness of approximately 1–3% of a width of the active area region.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to preventing parasitic leakage from parasitic corner devices in field effect transistors (FETs). By filling the divots formed adjacent to active areas of the FET, gate conductive material is prevented from entering the divot. This results in a dramatic increase in a threshold voltage of the parasitic corner devices of the FET. Further improvements are achieved by the present invention by providing active area implantation before the divot-filling spacers are formed. This further increases the threshold voltage of the parasitic corner devices.

Figure 2:
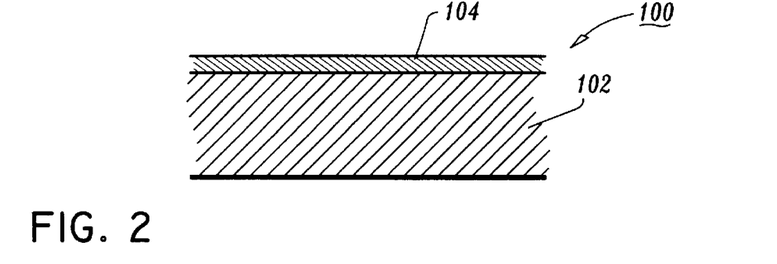
FIG. 2 is a cross-sectional view of a partially fabricated semiconductor device showing a mask layer formed on a substrate for the present invention.

Referring now in specific detail to the drawings in which like reference numerals identify similar or identical elements throughout the several views, and initially to FIG. 2, a cross-sectional view of a partially fabricated semiconductor device 100. A substrate 102 is preferably formed from monocrystalline silicon, although other substrate materials may be employed. A mask layer 104 is formed on substrate 102. Mask layer 104 may include a photoresist or a dielectric mask layer.

Figure 3:
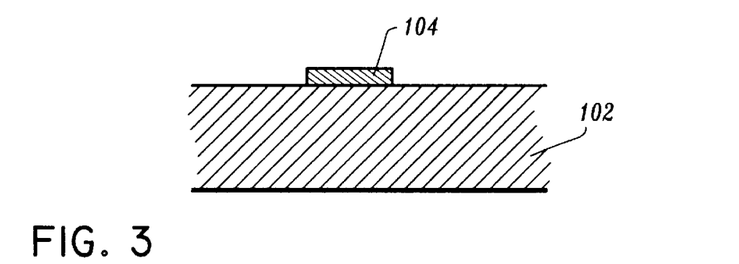
FIG. 3 is a cross-sectional view of the semiconductor device of FIG. 2 showing the mask layer patterned for the present invention.
Figure 4:
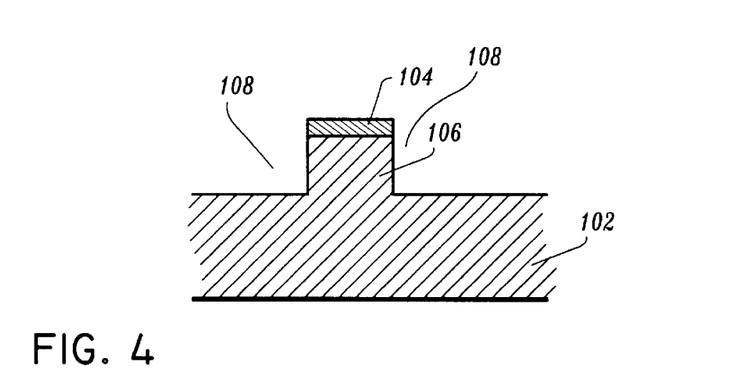
FIG. 4 is a cross-sectional view of the semiconductor device of FIG. 3 showing trenches formed in the substrate for shallow trench isolation regions for the present invention.
Figure 5:
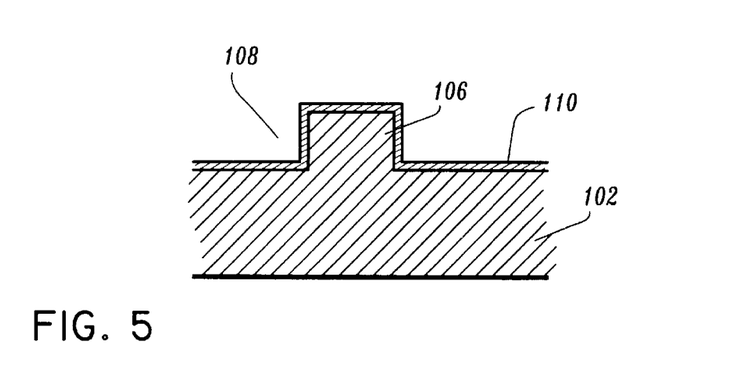
FIG. 5 is a cross-sectional view of the semiconductor device of FIG. 4 showing a liner deposited for the present invention.

Referring to FIGS. 3 and 4, mask layer 104 is patterned to define an active area region 106 in substrate 102. Trenches 108 are formed on opposite sides of active area region 106. Trenches are preferably etched by employing an anisotropic etch, such as reactive ion etching. Referring to FIG. 5, remaining portions of mask layer 104 are removed and a liner 110 is deposited to line trenches 108 and active area region 106. Liner 110 preferably includes silicon nitride material.

Figure 6A:
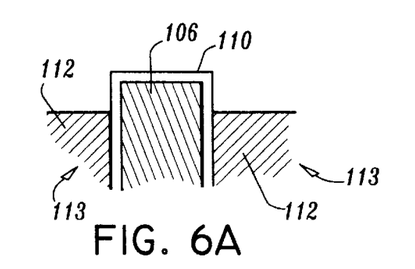
FIGS. 6A and 6B is a cross-sectional view of the semiconductor device of FIG. 5 showing the trenches filled to form shallow trench isolation regions below and above, the active area region, respectively, in accordance with the present invention.
Figure 6B:
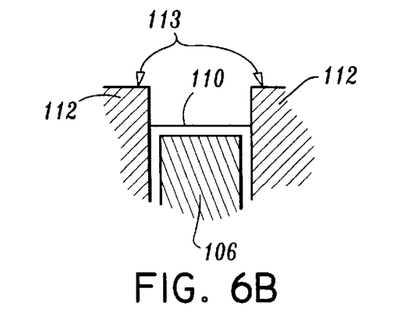

Referring to FIG. 6A, trenches 108 are filled with isolation material 112. Isolation material 112 preferably includes silicon dioxide, although other dielectric materials may be employed. FIG. 6A shows isolation material 112 at about the same height as active area region 106. However, isolation material 112 may be lower than or higher than active area region 106 as respectively shown in FIGS. 6A and 6B. Advantageously, the present invention may be employed in any of these situations. Isolation material 112 forms shallow trench isolation regions 113.

Figure 7A:
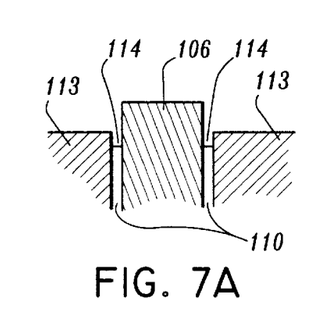
FIGS. 7A and 7B is a cross-sectional view of the semiconductor device of FIG. 6A and 6B, respectively, showing the liner removed from the active area region in accordance with the present invention.
Figure 7B:
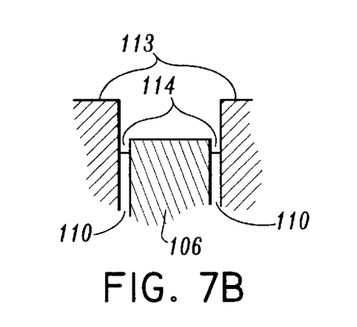

Referring to FIGS. 7A and 7B, liner 110 is stripped from active area region 106. This forms a divot 114 between active area region 106 and shallow trench isolation regions 113.

Figure 8A:
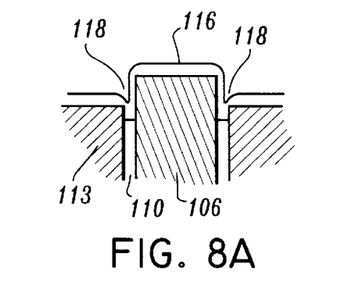
FIGS. 8A and 8B is a cross-sectional view of the semiconductor device of FIG. 7A and 7B, respectively, showing a gate oxide formed in accordance with the present invention.
Figure 8B:
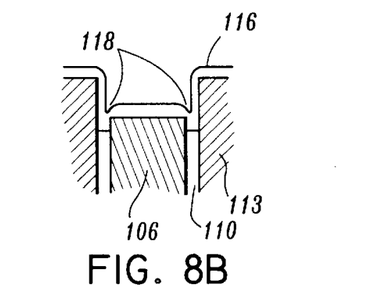

Referring to FIGS. 8A and 8B, a gate oxide layer 116 is thermally grown over active area region 106 and shallow trench isolation regions 113. This fills in a portion of divot 114, but a divot 118 remains in gate oxide layer 116. Conventionally, this divot 116 fills with gate conductor material to form the parasitic corner devices.

Figure 9A:
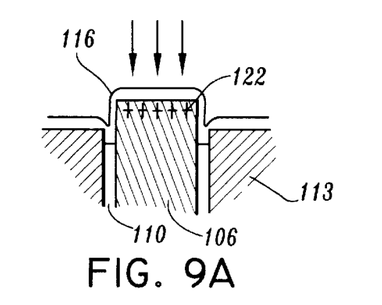
FIGS. 9A and 9B is a cross-sectional view of the semiconductor device of FIG. 8A and 8B, respectively, showing implantation of the active area region in accordance with the present invention.
Figure 9B:
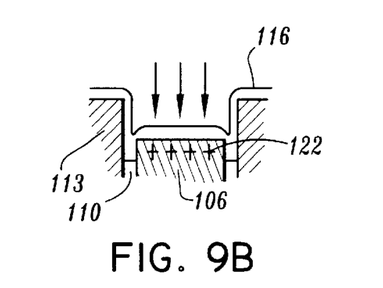
Figure 13:
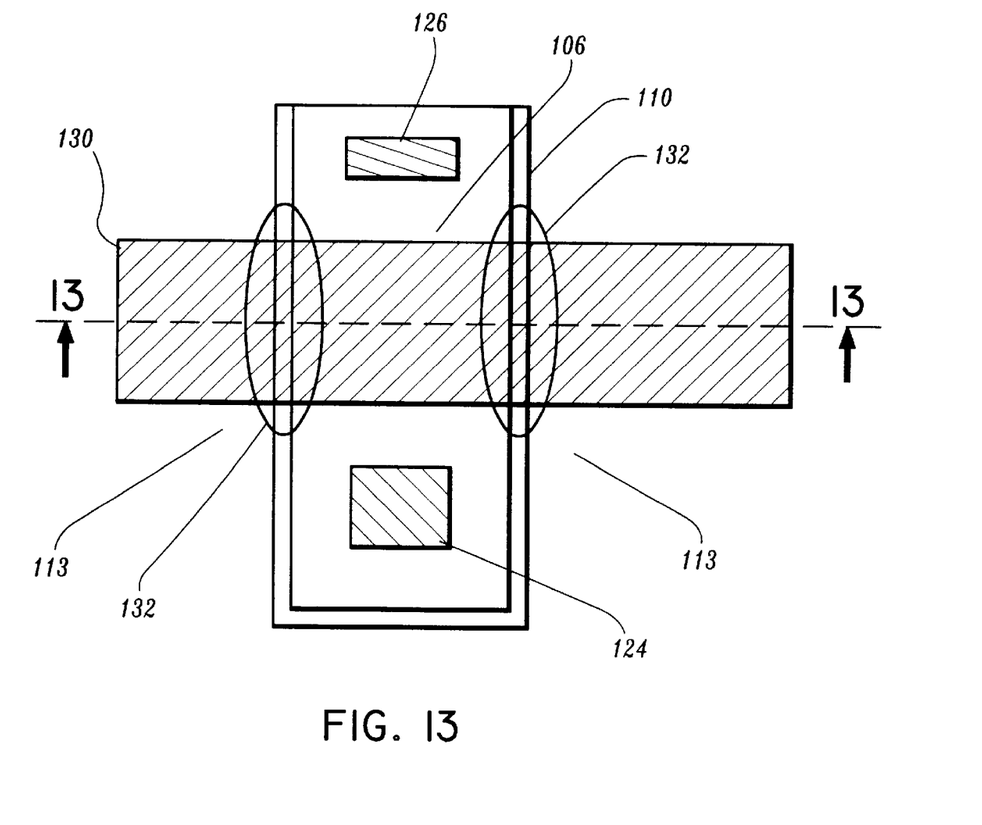
FIG. 13 is a top view of a field effect transistor of FIGS. 12A and 12B in accordance with the present invention.

Referring to FIGS. 9A and 9B, implantation of active area regions 106 is now performed. Advantageously, the implantation of dopants is performed prior to the introduction of a spacer layer (120 of FIGS. 10A and 10B) which will be described in later steps. Implantation of dopants is preferably performed by employing ion implantation techniques known to those skilled in the art. Implantation is performed for sources and drains of transistor devices as well as implantations in a channel region (See FIG. 1B). Implantation of dopants form active areas 122 which include source 124 and drain 126 regions (FIG. 13). Implantation of dopants for source and drain regions are preferably performed after a gate structure is formed to self-align the source and drain regions.

Figure 10A:
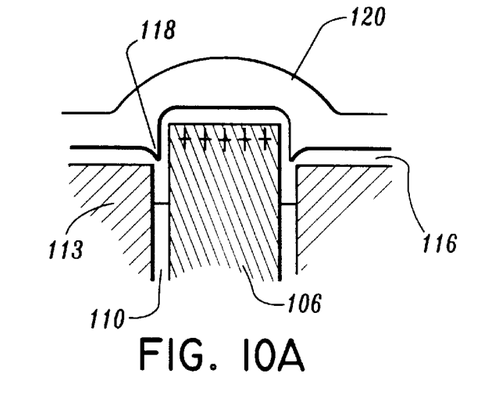
FIGS. 10A and 10B is a cross-sectional view of the semiconductor device of FIG. 9A and 9B, respectively, showing a spacer layer formed for filling divots in accordance with the present invention.
Figure 10B:
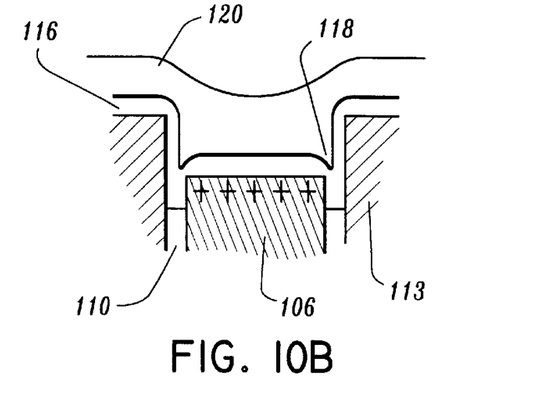

Referring to FIGS. 10A and 10B, a spacer layer 120 is deposited on gate oxide layer over shallow trench isolation regions 113. Spacer layer 120 may include a nitride or oxide. In a preferred embodiment, spacer layer 120 is deposited by employing a chemical vapor deposition (CVD) process, although other processes may be employed as well. Spacer layer 120 is preferably a nitride, such as silicon nitride for that spacer layer can be selectively etched relative to the underlying gate oxide layer 116. If an oxide is employed for spacer layer 120, the process for forming the oxide layer (e.g., CVD) provides some selectivity for etching spacer layer 120 relative to gate oxide layer 116. Although if a nitride "gate oxide" is employed, silicon dioxide for spacer layer is preferred. Spacer layer 120 is preferably conformally applied over gate oxide layer 116. In a preferred embodiment, spacer layer 120 is deposited at a thickness of between about 1% to about 3% of the active area width to provide sufficient filling of divot 118. Advantageously, spacer layer 120 is deposited after implantation of active area regions 106. In this way, spacer layer 120 is substantially free from dopants which would promote formation of parasitic corner devices by lowering a threshold voltage of the corner devices as will be described below.

Figure 11A:
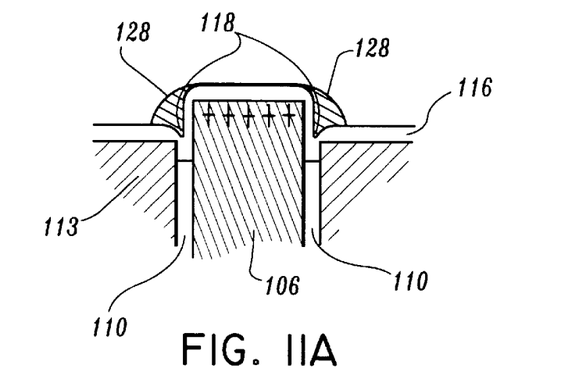
FIGS. 11A and 11B is a cross-sectional view of the semiconductor device of FIG. 10A and 10B, respectively, showing spacers formed in the divots in accordance with the present invention.
Figure 11B:
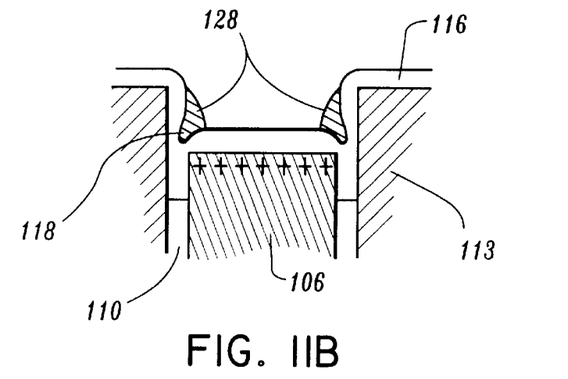

Referring to FIGS. 11A and 11B, spacer layer 120 is selectively etched to remove material from gate oxide layer 116. The etching process is preferably an anisotropic etch process, such as a reactive ion etch (RIE) process or equivalents. By etching spacer layer 120, anisotropically, spacers 128 are formed in divots 118 in accordance with the invention.

Figure 12A:
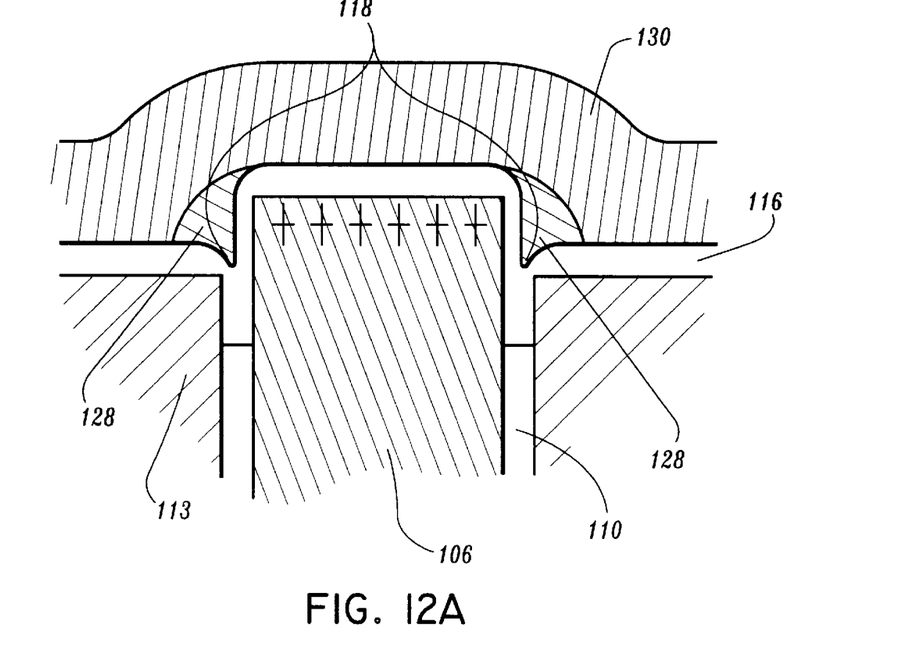
FIGS. 12A and 12B is a cross-sectional view of the semiconductor device of FIG. 11A and 11B, respectively, showing a gate conductor layer deposited which is separated from corners of the active area region by the spacers in accordance with the present invention.
Figure 12B:
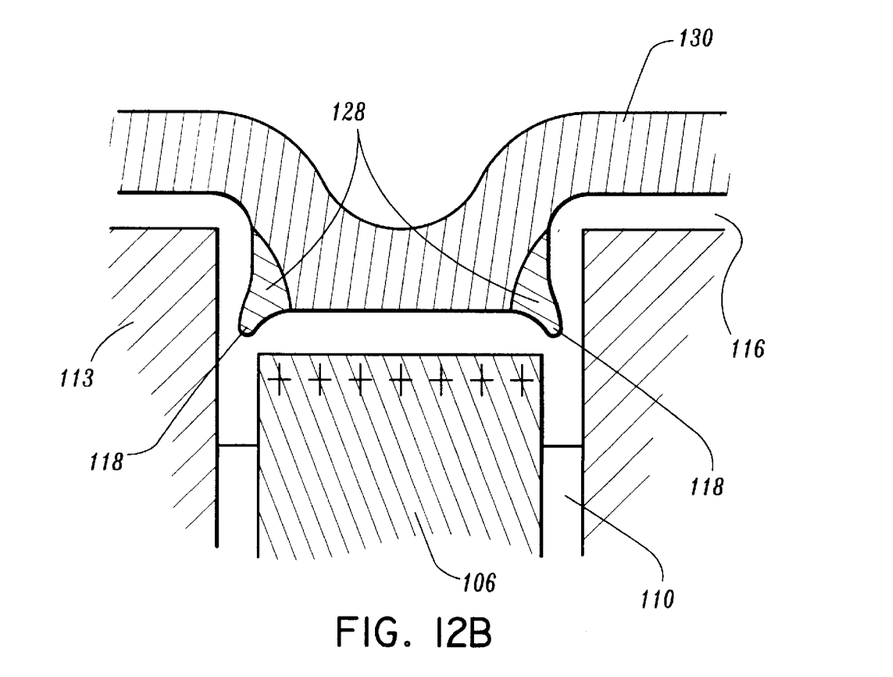

Referring to FIGS. 12A and 12B, a gate conductor layer(s) 130 is/are deposited and patterned over active area regions 106 in contact with gate oxide 116 and spacers 128. Gate conductor material preferably includes polysilicon.

Advantageously, the present invention excludes any gate conductor material of layer 130 from entering divot 118, and additionally, increases the distance between active are region 106 and gate conductor layer 130 at the corners of the active area regions 106. The parasitic corner devices are therefore impeded by an increased distance between gate conductor layer 130 and active areas. Since spacers 128 are formed after dopant implantation, spacers 128 are substantially free from dopants which further increases the threshold voltage of corner devices. Further, by providing the implantation of dopants prior to the formation of spacers 128, active area regions 106 are doped in a more uniform manner resulting in a homogenous dopant density between the corners and the middle of the active areas. This homogeneity reduces the threshold voltage of the corner devices even further.

Referring to FIG. 13, a top view of a field effect transistor (FET) is shown. Active areas region 106 includes source 124 and drain 126. Liner 110 separates active area region 106 form shallow trench isolation regions 113. A gate conductor layer 130 forms the gate of the FET. Corners where parasitic devices form are indicated by regions 132. Cross-sectional views of FIGS. 2–12B have been taken at section line 13—13 of FIG. 13.

Having described preferred embodiments for a novel spacer process to eliminate corner transistor device (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming spacers for preventing formation of parasitic corner devices in a transistor, comprising the steps of:
    etching trenches into a semiconductor substrate to form an active area region;
    lining the trenches and the active area region with a first dielectric material;
    forming shallow trench isolation regions adjacent to the active area region by filling the trenches with a second dielectric material;
    removing the first dielectric material from the active area region;
    forming a gate oxide over the active area region wherein divots form between the active area region and the shallow trench isolation regions;
    implanting dopants into the active area region to form a source and drain of the transistor;
    after the step of implanting, depositing a spacer layer formed from a third dielectric material over the gate oxide layer to fill the divots, the spacer layer being free from the dopants; and
    anisotropically etching the spacer layer to form spacers in the divots such that gate conductor material is prevented from entering the divots and the gate conductor material is spaced apart from corners of the active area region by the spacers to prevent the formation of the parasitic corner devices.

2. The method as recited in claim 1, wherein the third dielectric material is selectively etched relative to the gate oxide.

3. The method as recited in claim 1, wherein the third dielectric material includes one of a nitride and an oxide.

4. The method as recited in claim 1, wherein the third dielectric material is deposited by a chemical vapor deposition process.

5. The method as recited in claim 1, wherein the first dielectric material includes silicon nitride.

6. The method as recited in claim 1, wherein the second dielectric material includes silicon oxide.

7. The method as recited in claim 1, wherein the step of forming shallow trench isolation regions adjacent to the active area region by filling the trenches with a second dielectric material includes the step of forming shallow trench isolation regions adjacent to the active area region such that the active area region is disposed above a top surface of the second dielectric material.

8. The method as recited in claim 1, wherein the step of forming shallow trench isolation regions adjacent to the active area region by filling the trenches with a second dielectric material includes the step of forming shallow trench isolation regions adjacent to the active area region such that the active area region is disposed below a top surface of the second dielectric material.

9. The method as recited in claim 1, wherein the step of depositing a spacer layer includes depositing the spacer layer with a thickness of between about 1% to about 3% of a width of the active area region.

10. A method for forming a dielectric spacers for preventing formation of parasitic corner devices in a field effect transistor, comprising the steps of:
    etching trenches into a silicon substrate to form an active area region;
    lining the trenches and the active area region with silicon nitride;
    forming shallow trench isolation regions adjacent to the active area region by filling the trenches with a silicon dioxide;
    removing the silicon nitride from the active area region;
    forming a gate oxide over the active area region wherein divots form between the active area region and the shallow trench isolation regions;
    implanting dopants into the active area region to form a source and drain of the field effect transistor;
    after the step of implanting, depositing a spacer layer formed from a third dielectric material over the gate oxide layer to fill the divots, the spacer layer being free from the dopants; and
    anisotropically etching the spacer layer to form spacers in the divots such that gate conductor material is prevented from entering the divots and the gate conductor material is spaced apart from corners of the active area region by the spacers to prevent the formation of the parasitic corner devices.

11. The method as recited in claim 10, wherein the third dielectric material is selectively etched relative to the gate oxide.

12. The method as recited in claim 10, wherein the third dielectric material includes one of a nitride and an oxide.

13. The method as recited in claim 10, wherein the third dielectric material is deposited by a chemical vapor deposition process.

14. The method as recited in claim 10, wherein the step of forming shallow trench isolation regions adjacent to the active area region by filling the trenches with a silicon dioxide includes the step of forming shallow trench isolation regions adjacent to the active area region such that the active area region is disposed above a top surface of the silicon dioxide.

15. The method as recited in claim 10, wherein the step of forming shallow trench isolation regions adjacent to the active area region by filling the trenches with a silicon dioxide includes the step of forming shallow trench isolation regions adjacent to the active area region such that the active area region is disposed below a top surface of the silicon dioxide.

16. The method as recited in claim 10, wherein the step of depositing a spacer layer includes depositing the spacer layer with a thickness of between about 1% to about 3% of a width of the active area region.

* * * * *